US009202986B2

(12) United States Patent
Ito et al.

(10) Patent No.: US 9,202,986 B2
(45) Date of Patent: *Dec. 1, 2015

(54) SEMICONDUCTOR LIGHT EMITTING DEVICE AND METHOD FOR MANUFACTURING THE SAME

(71) Applicant: Kabushiki Kaisha Toshiba, Minato-ku (JP)

(72) Inventors: Toshihide Ito, Tokyo (JP); Toshiyuki Oka, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/088,981

(22) Filed: Nov. 25, 2013

(65) Prior Publication Data
US 2014/0077250 A1    Mar. 20, 2014

Related U.S. Application Data

(62) Division of application No. 13/218,728, filed on Aug. 26, 2011, now Pat. No. 8,623,676.

(30) Foreign Application Priority Data

Jan. 26, 2011 (JP) .................................. 2011-14117

(51) Int. Cl.
*H01L 33/40* (2010.01)
*H01L 33/16* (2010.01)
(Continued)

(52) U.S. Cl.
CPC ............... *H01L 33/40* (2013.01); *H01L 33/16* (2013.01); *H01L 33/007* (2013.01); *H01L 33/32* (2013.01)

(58) Field of Classification Search
CPC ..... H01L 33/40; H01L 29/04; H01L 21/2026; H01L 27/1285; H01L 29/66757; H01L 29/78675

USPC ........................ 257/99, 13, 76, 98, E33.064
See application file for complete search history.

(56) References Cited

U.S. PATENT DOCUMENTS

2006/0183625 A1* 8/2006 Miyahara ..................... 501/98.4
2007/0284590 A1* 12/2007 Goto et al. ...................... 257/79

FOREIGN PATENT DOCUMENTS

CN    101312228 A    11/2008
JP    6-188455    7/1994
(Continued)

OTHER PUBLICATIONS

Office Action issued Nov. 15, 2011, in Japanese Patent Application No. 2011-014117 with English Translation.
(Continued)

*Primary Examiner* — Chuong A Luu
*Assistant Examiner* — Rodolfo Fortich
(74) *Attorney, Agent, or Firm* — Oblon, McClelland, Maier & Neustadt, L.L.P.

(57) ABSTRACT

According to one embodiment, a semiconductor light emitting device includes first and second conductive layers, a first semiconductor layer of a first conductivity type, a second semiconductor layer of a second conductivity type, and a light emitting part. The second semiconductor layer is provided between the first conductive layer and the first semiconductor layer. The light emitting part is provided between the first and second semiconductor layers. The second conductive layer is in contact with the second semiconductor layer and the first conductive layer between the second semiconductor layer and the first conductive layer. The first and second conductive layers are transmittable to light emitted from the light emitting part. The first conductive layer includes a polycrystal having a first average grain diameter. The second conductive layer includes a polycrystal having a second average grain diameter of 150 nanometers or less and smaller than the first average grain diameter.

11 Claims, 8 Drawing Sheets

(51) Int. Cl.
  *H01L 33/00* (2010.01)
  *H01L 33/32* (2010.01)

(56) References Cited

FOREIGN PATENT DOCUMENTS

| | | |
|---|---|---|
| JP | 2003-124518 | 4/2003 |
| JP | 2004-165654 | 6/2004 |
| JP | 2004-259764 | 9/2004 |
| JP | 2004-296616 | 10/2004 |
| JP | 2005-301255 | 10/2005 |
| JP | 2006-324511 | 11/2006 |
| JP | 2007-149966 | 6/2007 |
| JP | 2009-94108 A | 4/2009 |
| WO | WO 2009/110539 A1 | 9/2009 |

OTHER PUBLICATIONS

Chinese Office Action issued Jan. 30, 2014, in Chinese Patent Application No. 201210018042.9 with English translation.
Combined Office Action and Search Report issued Sep. 19, 2014 in Chinese Patent Application No. 201210018042.9 (with English translation and English translation of category of cited documents).

* cited by examiner

US 9,202,986 B2

SEMICONDUCTOR LIGHT EMITTING DEVICE AND METHOD FOR MANUFACTURING THE SAME

CROSS-REFERENCE TO RELATED APPLICATIONS

This application is a divisional of U.S. application Ser. No. 13/218,728 filed Aug. 26, 2011, and is based upon and claims the benefit of priority from the prior Japanese Patent Application No. 2011-14117, filed on Jan. 26, 2011; the entire contents of each of which are incorporated herein by reference.

FIELD

Embodiments described herein relate generally to a semiconductor light emitting device and a method for manufacturing the same.

BACKGROUND

In recent years, research and development of a blue or green light emitting diode using a GaN-based semiconductor have been proceeding. In an FU (Face UP) type light emitting diode, that is, one with a structure in which light is extracted from the opposite side of a growth substrate, for example, ITO (Indium Tin Oxide) is used as a conductive layer on a p-type GaN contact layer. Such a conductive layer is required to be excellent in the electrical characteristics, such as volume resistivity and contact resistance, and excellent in processability.

DETAILED DESCRIPTION

Figure 1:
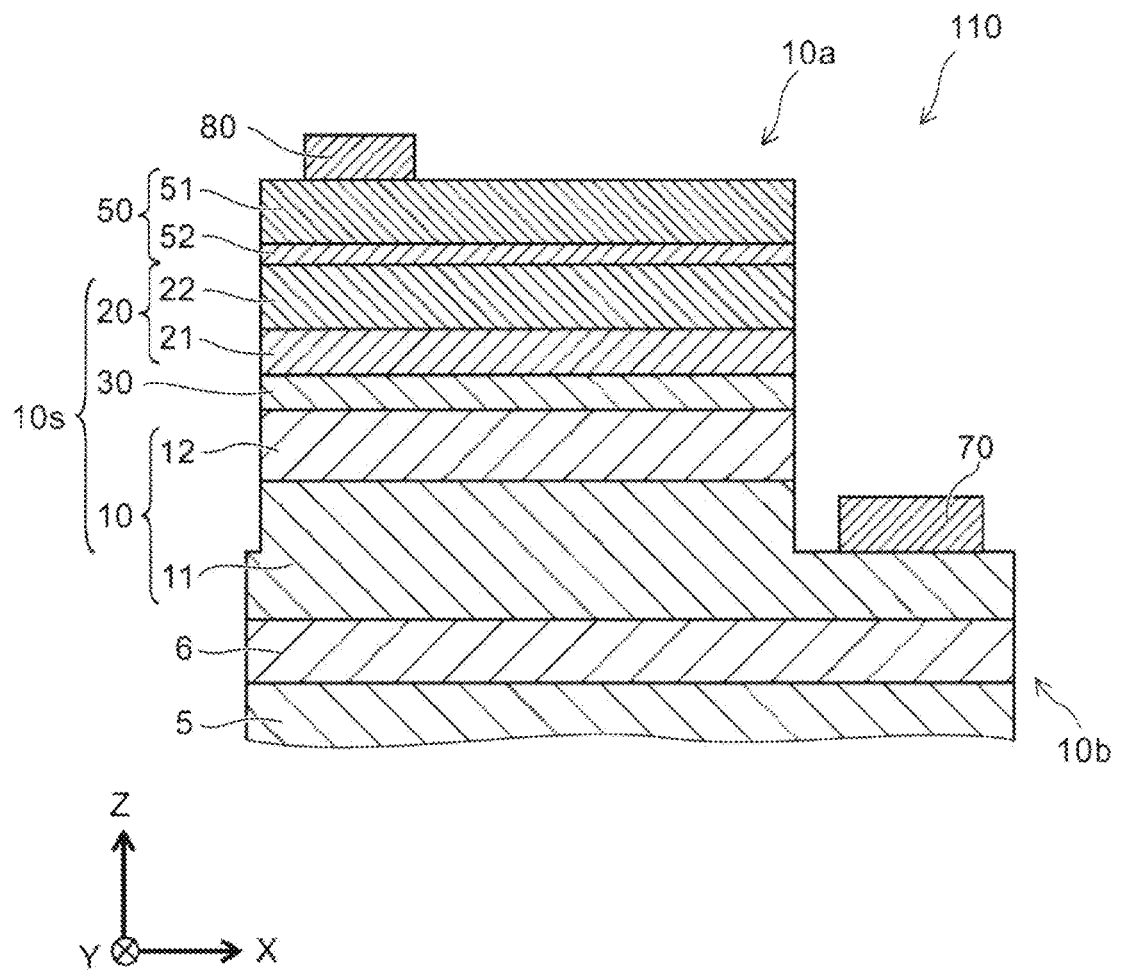
FIG. 1 is a schematic sectional view illustrating the configuration of a semiconductor light emitting device according to an embodiment.

In general, according to one embodiment, a semiconductor light emitting device includes a first conductive layer, a first semiconductor layer of a first conductivity type, a second semiconductor layer of a second conductivity type, a light emitting part, and a second conductive layer. The second semiconductor layer is provided between the first conductive layer and the first semiconductor layer. The light emitting part is provided between the first semiconductor layer and the second semiconductor layer. The second conductive layer is in contact with the second semiconductor layer and with the first conductive layer between the second semiconductor layer and the first conductive layer. The first conductive layer includes a polycrystal having a first average grain diameter. The first conductive layer is transmittable with respect to light emitted from the light emitting part. The second conductive layer includes a polycrystal having a second average grain diameter of 150 nanometers or less. The second average grain diameter is smaller than the first average grain diameter, and the second conductive layer is transmittable with respect to the light.

In general, according to another embodiment, a method of manufacturing a semiconductor light emitting device is disclosed. The semiconductor light emitting device includes a first conductive layer, a first semiconductor layer of a first conductivity type, a second semiconductor layer of a second conductivity type, a light emitting part, and a second conductive layer. The second semiconductor layer is provided between the first conductive layer and the first semiconductor layer. The light emitting part is provided between the first semiconductor layer and the second semiconductor layer. The second conductive layer is in contact with the second semiconductor layer and with the first conductive layer between the second semiconductor layer and the first conductive layer. The first conductive layer includes a polycrystal having a first average grain diameter. The first conductive layer is transmittable with respect to light emitted from the light emitting part. The second conductive layer includes a polycrystal having a second average grain diameter smaller than the first average grain diameter. The second conductive layer is transmittable with respect to the light. The method can include forming a first film serving as the second conductive layer on the second semiconductor layer in an atmosphere of a noble gas by a sputtering method using a first electric power. The method can include forming a second film serving as the first conductive layer on the first film in an atmosphere of a noble gas by the sputtering method using a second electric power smaller than the first electric power. In addition, the method can include forming the first conductive layer and the second conductive layer by subjecting the first film and the second film to a heat treatment in an atmosphere including oxygen.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the application and the drawings of the application, components similar to those described in regard to a drawing thereinabove are marked with like reference numerals, and a detailed description is omitted as appropriate.

(Embodiment)

FIG. 1 is a schematic sectional view illustrating the configuration of a semiconductor light emitting device according to an embodiment.

As shown in FIG. 1, a semiconductor light emitting device 110 according to the embodiment includes a first semiconductor layer 10 of a first conductivity type, a second semiconductor layer 20 of a second conductivity type, a light emitting part 30, a first conductive layer 51, and a second conductive layer 52.

The second semiconductor layer 20 is provided between the first conductive layer 51 and the semiconductor layer 20.

The light emitting part 30 is provided between the first semiconductor layer 10 and the second semiconductor layer 20.

The first conductive layer 51 includes a polycrystal. The first conductive layer 51 is transmittable to light emitted from the light emitting part 30.

The second conductive layer 52 is in contact with the second semiconductor layer 20 and the first conductive layer 51 between the second semiconductor layer 20 and the first conductive layer 51. The second conductive layer 52 includes a polycrystal. The second conductive layer 52 is transmittable to the above-mentioned light.

That is, the light emitting part 30 is provided on the first semiconductor layer 10. The second semiconductor layer 20 is provided on the light emitting part 30. The second conductive layer 52 is provided on the second semiconductor layer 20. The first conductive layer 51 is provided on the second conductive layer 52.

The first conductive layer 51 and the second conductive layer 52 are included in a transparent electrode 50.

For example, the first conductivity type is an n-type and the second conductivity type is a p-type. However, the embodiment is not limited to the above and the first conductivity type may be a p-type and the second conductivity type may be an n-type. Hereinafter, explanation is given on the assumption that the first conductivity type is an n-type and the second conductivity type is a p-type.

Here, it is assumed that a direction from the first semiconductor layer 10 toward the second semiconductor layer 20 is a Z-axis (first axis). One axis perpendicular to the Z-axis is assumed to be an X-axis (second axis). An axis perpendicular to the Z-axis and the X-axis is assumed to be a Y-axis (third axis).

The first semiconductor layer 10, the second semiconductor layer 20, and the light emitting part 30 include, for example, a nitride semiconductor.

As shown in FIG. 1, the semiconductor light emitting device 110 can further include a substrate 5 and a buffer layer 6. The first semiconductor layer 10 is arranged between the substrate 5 and the light emitting part 30. The buffer layer 6 is arranged between the substrate 5 and the first semiconductor layer 10.

As the substrate 5, a substrate made up of, for example, sapphire is used. A major surface of the substrate 5 is referred to as a (0001) surface, that is, a c surface. The major surface of the substrate 5 may be inclined at an angle of, for example, 5 degrees or less with respect to the (0001) surface. As the buffer layer 6, for example, an $Al_{x0}Ga_{1-x0}N$ ($0 \le x0 \le 1$) layer is used.

The first semiconductor layer 10 includes, for example, a first n-side layer 11 and a second n-side layer 12. The second n-side layer 12 is provided between the first n-side layer 11 and the light emitting part 30. The first n-side layer 11 functions as an n-type contact layer. The second n-side layer 12 functions as an n-type guide layer. As the first n-side layer 11, a GaN layer, for example, to which n-type impurities (for example, silicon etc.) are added in a high concentration, is used. As the second n-side layer 12, a GaN layer etc., to which n-type impurities are added in, for example, a concentration lower than that of the first n-side layer 11, is used.

The second semiconductor layer 20 includes a first p-side layer 21 and a second p-side layer 22. The first p-side layer 21 is provided between the second p-side layer 22 and the light emitting part 30. The first p-side layer 21 functions as, for example, an electron overflow prevention layer (suppression layer). The second p-side layer 22 functions as a p-type contact layer. As the first p-side layer 21, an AlGaN layer etc., to which p-type impurities (for example, magnesium) are added, is used. As the second p-side layer 22, a GaN layer etc., to which p-type impurities are added in a high concentration, is used.

The semiconductor light emitting device 110 further includes a first electrode 70 and a second electrode 80. The first electrode 70 is electrically connected to the first semiconductor layer 10 (specifically, the first n-side layer 11, which is an n-type contact layer). The second electrode 80 is electrically connected to, for example, the transparent electrode 50.

The second electrode 80 is electrically connected to the second semiconductor layer 20 (specifically, the second p-side layer 22, which is a p-type contact layer) via the transparent electrode 50.

In the specific example, the second electrode 80 is provided on the transparent electrode 50 (specifically, the first conductive layer 51) provided on the second semiconductor layer 20 (specifically, the second p-side layer 22, which is a p-side contact layer).

As the first electrode 70, for example, a stacked film of a Ti film, Pt film, and Au film is used. As the second electrode 80, for example, a stacked film of a Ni film and Au film is used.

By a voltage applied between the first electrode 70 and the second electrode 80, an electric current is supplied to the light emitting part 30 via the first semiconductor layer 10, the second semiconductor layer 20 and the transparent electrode 50, and light (emission light) is emitted from the light emitting part 30.

The light emitting part 30 emits at least any of ultraviolet, purple, blue, and green light. That is, the wavelength (major wavelength) of emission light emitted from the light emitting part 30 is 360 nm or more and 580 nm or less.

A stacked structure body 10s includes the first semiconductor layer 10, the second semiconductor layer 20, and the light emitting part 30. In the specific example, on a first major surface 10a on the side of the second semiconductor layer 20 of the stacked structure body 10s, a part of the first semiconductor layer 10, a part of the light emitting part 30, and a part of the second semiconductor layer 20 are removed.

The stacked structure body 10s has the first major surface 10a on the side of the second semiconductor layer 20 and a second major surface 10b on the side of the first semiconductor layer 10. The second major surface 10b is a surface on the opposite side of the first major surface 10a in the stacked structure body 10s. The first semiconductor layer 10 is exposed on the first major surface 10a of the stacked structure body 10s.

That is, the light emitting part 30 is provided between a part of the first semiconductor layer 10 and the second semiconductor layer 20. On the side of the first major surface 10a, the first electrode 70 is provided in contact with the first semiconductor layer 10. On the side of the second major surface 10b, the second electrode 80 is provided in contact with the transparent electrode 50 contacting the second semiconductor layer 20. On the second major surface 10b of the stacked structure body 10s, the substrate 5 and the buffer layer 6 are provided.

The light emitting part 30 has a single quantum well (SQW) structure or a multi quantum well (MQW) structure.

Figure 2A:
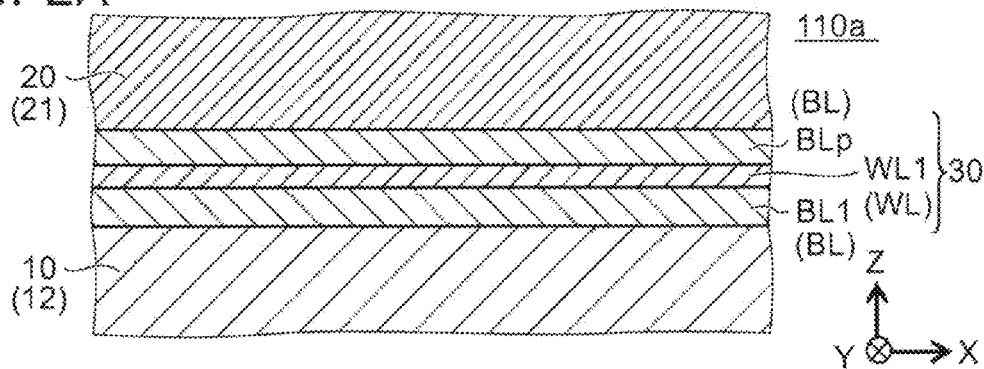
FIGS. 2A to 2C are schematic sectional views illustrating the configuration of a part of the semiconductor light emitting device according to the embodiment.
Figure 2B:
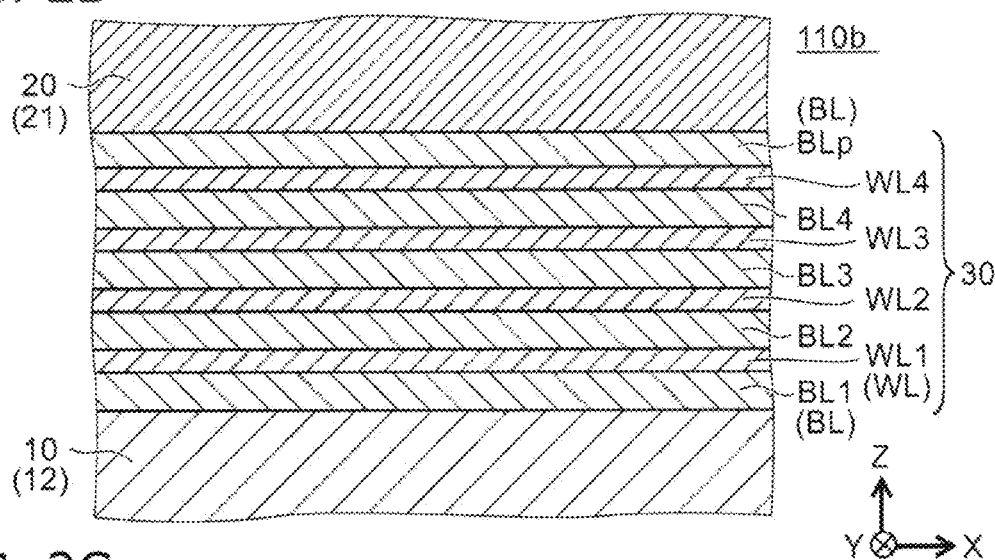
Figure 2C:
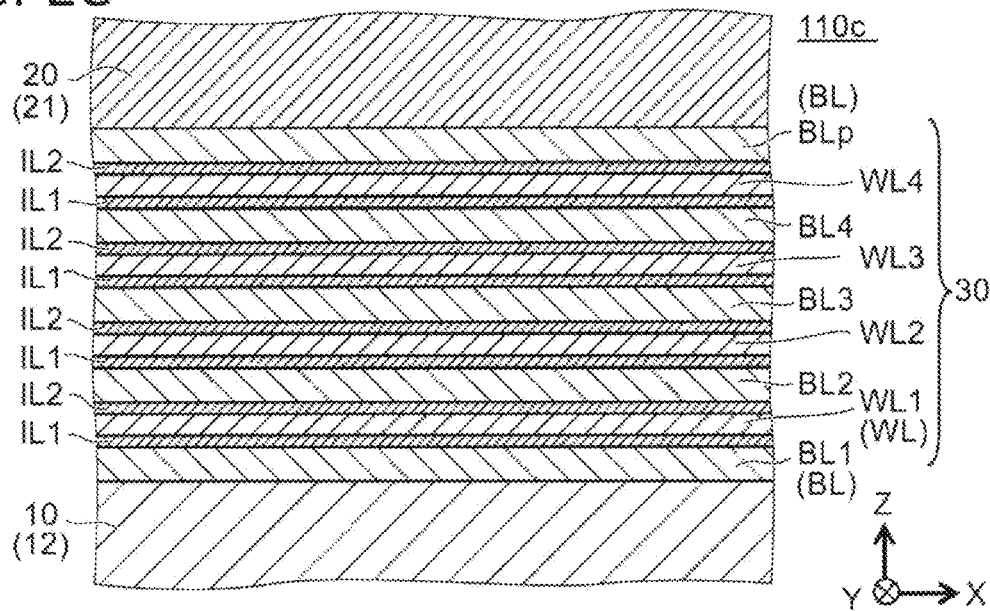

FIGS. 2A to 2C are schematic sectional views illustrating the configuration of a part of the semiconductor light emitting device according to the embodiment.

That is, these figures are schematic views illustrating an example of the configuration of the light emitting part 30.

As shown in FIG. 2A, in a semiconductor light emitting device 100a according to the embodiment, the light emitting part 30 has the SQW structure. That is, the light emitting part 30 includes a barrier layer BL (first barrier layer BL1), a p-side barrier layer BLp, and a well layer WL (first well layer WL1) provided between the first barrier layer BL1 and the p-side barrier layer BLp.

It is noted that in the specification of the application, the "stacked layer" includes a case where another layer is inserted and stacked, in addition to a case where layers are stacked directly. For example, as will be described later, another layer may be provided between the first barrier layer BL1 and the first well layer WL1 and between the first well layer WL1 and the p-side barrier layer BLp.

As shown in FIG. 2B, in a semiconductor light emitting device 100b according to the embodiment, the light emitting part 30 has the MQW structure. That is, the light emitting part 30 includes a plurality of barrier layers (in the example, the first to fourth barrier layers BL1 to BL4 and the p-side barrier layer BLp) stacked along the Z-axis and well layers (the first to fourth well layers WL1 to WL4) provided between each of the plurality of barrier layers. In the specific example, four well layers are provided, but the number of well layers is arbitrary.

As described above, the light emitting part 30 further includes an N-th barrier layer provided on the opposite side of an (N−1)th barrier layer of an (N−1)th well layer WL and an N-th well layer provided on the opposite side of the (N−1)th well layer of the N-th barrier layer, where N is an integer of two or more.

As shown in FIG. 2C, in a semiconductor light emitting device 110c according to the embodiment, the light emitting part 30 further includes an intermediate layer provided in each of regions between the barrier layers and the well layers, respectively. That is, the light emitting part 30 further includes a first intermediate layer IL1 provided between the (N−1)th barrier layer and the (N−1)th well layer and a second intermediate layer IL2 provided between the (N−1)th well layer and the N-th barrier layer. Furthermore, the second intermediate layer IL2 is provided between the N-th well layer and the p-side barrier layer BLp. The first intermediate layer IL1 and the second intermediate layer IL2 are provided as necessary and can be omitted. Moreover, it may also be possible to provide the first intermediate layer IL1 and omit the second intermediate layer IL2. Alternatively, it may also be possible to provide the second intermediate layer IL2 and omit the first intermediate layer IL1.

As the barrier layer (for example, the first to fourth barrier layers BL1 to BL4, the N-th barrier layer), for example, $In_{x1}Al_{y1}Ga_{1-x1-y1}N$ ($0 \leq x1 < 1$, $0 \leq y1 < 1$, $x1+y1 \leq 1$) can be used. As the barrier layer, for example, $In_{0.02}Al_{0.33}Ga_{0.65}N$ can be used. The thickness of the barrier layer can be set to, for example, 12.5 nm.

As the p-side barrier layer BLp, for example, $In_{x2}Al_{y2}Ga_{1-x2-y2}N$ ($0 \leq x2 < 1$, $0 \leq y2 < 1$, $x2+y2 \leq 1$) can be used. As the p-side barrier layer BLp, for example, $In_{0.02}Al_{0.33}Ga_{0.65}N$ can be used. The thickness of the barrier layer can be set to, for example, 12.5 nm.

As the well layer (for example, the first well layer WL1 to WL4, the N-th well layer), for example, $In_{x3}Al_{y3}Ga_{1-x3-y3}N$ ($0 \leq x3 < 1$, $0 \leq y3 < 1$, $x3+y3 \leq 1$) can be used. As the well layer, for example, $In_{0.15}Ga_{0.85}N$ can be used. The thickness of the well layer can be set to, for example, 2.5 nm.

The composition ratio of In included in the well layer (ratio of the number of In atoms in the group III elements) is higher than the composition ratio of In included in the barrier layer (the first to fourth barrier layers BL1 to BL4, the N-th barrier layer, and the p-side barrier layer BLp) (ratio of the number of In atoms in the group III elements). This makes the band gap energy in the barrier layer greater than the band gap energy in the well layer.

As the first intermediate layer IL1, for example, $In_{x4}Ga_{1-x4}N$ ($0 \leq x4 < 1$) can be used. As the first intermediate layer IL1, for example, $In_{0.02}Ga_{0.98}N$ can be used. The thickness of the first intermediate layer IL1 can be set to, for example, 0.5 nm.

As the second intermediate layer IL2, for example, $In_{x5}Ga_{1-x5}N$ ($0 \leq x5 < 1$) can be used. As the second intermediate layer IL2, for example, $In_{0.02}Ga_{0.98}N$ can be used. The thickness of the second intermediate layer IL2 can be set to, for example, 0.5 nm.

It is noted that the composition ratio of In included in the well layer (ratio of the number of In atoms in the group III elements) is higher than the composition ratio of In included in the first intermediate layer IL1 and the second intermediate layer IL2 (ratio of the number of In atoms in the group III elements). This makes the band gap energy in the first intermediate layer IL1 and the second intermediate layer IL2 greater than the band gap energy in the well layer.

It is noted that it is possible to regard the first intermediate layer IL1 as a part of the barrier layer. Furthermore, it is also possible to regard the second intermediate layer IL2 as a part of the barrier layer. That is, the barrier layer stacked with the well layer may include a plurality of layers of different compositions.

It is noted that in the SQW structure illustrated in FIG. 2A, the first intermediate layer IL1 and the second intermediate layer IL2 may be provided. In this case, the first intermediate layer IL1 is provided between the first barrier layer BL1 and the first well layer WL1, and the second intermediate layer IL2 is provided between the first well layer WL1 and the p-side barrier layer BLp.

The above is an example of the configuration of the light emitting part 30, but the embodiment is not limited to this and there can be various modifications of the materials used for the barrier layer, the p-side barrier layer BLp, the well layer, the first intermediate layer IL1, and the second intermediate layer IL2 and their thicknesses. It is noted that as described above, the barrier layer, the p-side barrier layer BLp, the well layer, the first intermediate layer IL1, and the second intermediate layer IL2 include a nitride semiconductor.

Hereinafter, the configuration and characteristics of the transparent electrode 50 are described by taking the semiconductor light emitting device 110 as an example. The following description is applied to a semiconductor light emitting device having various configurations, such as the semiconductor light emitting devices 110a, 110b, and 110c.

The first conductive layer 51 and the second conductive layer 52 includes an oxide including at least one (kind of) element selected from the group of In, Sn, Zn, and Ti. As the first conductive layer 51 and the second conductive layer 52, for example, ITO is used. As the first conductive layer 51 and the second conductive layer 52, at least any of, for example, $In_2O_3$ and $SnO_2$ may be used.

As already described above, the first conductive layer 51 and the second conductive layer 52 include a polycrystal. That is, as the first conductive layer 51 and the second conductive layer 52, a polycrystalline film including a metal oxide is used. Here, in the polycrystal (polycrystalline film), a plurality of diffraction peaks are observed by X-ray diffraction measurement. It is noted that in the amorphousness (amorphous film), the sharp diffraction peak is not observed by the observation in the X-ray diffraction measurement but a broad halo peak is observed.

Figure 3A:
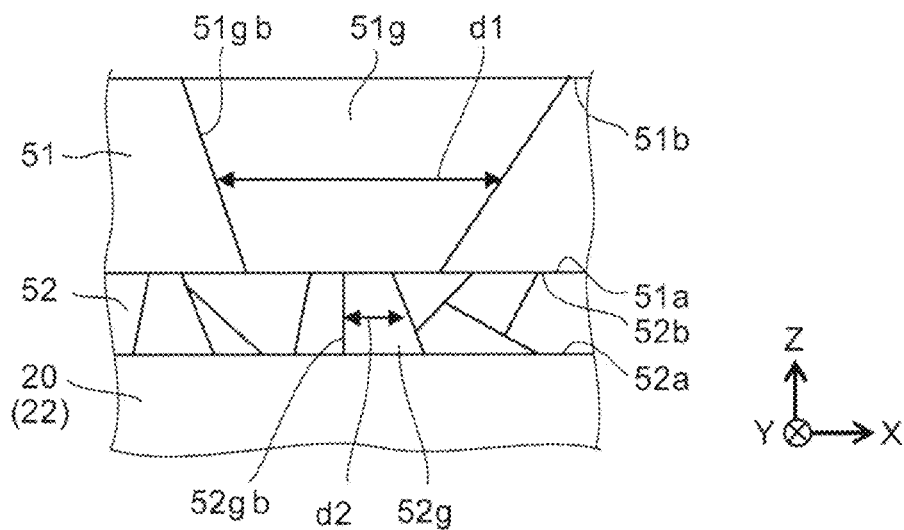
FIGS. 3A to 3C are schematic sectional views illustrating the configuration of a part of the semiconductor light emitting device according to the embodiment.
Figure 3B:
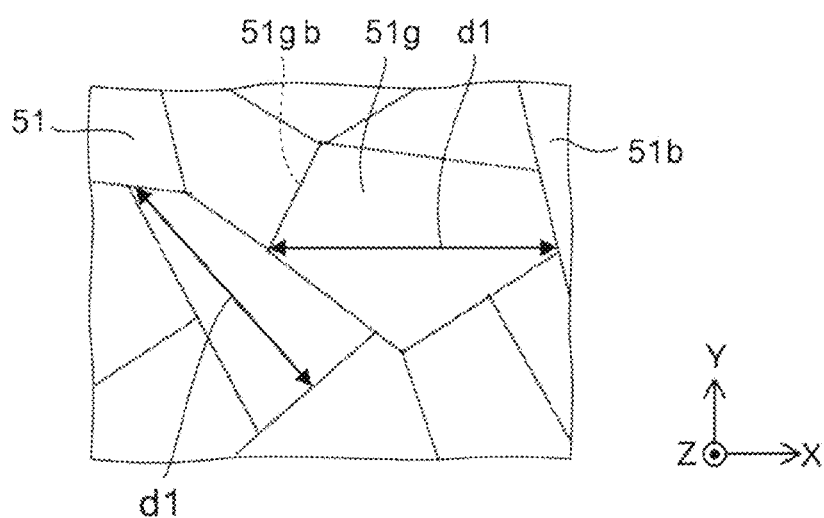
Figure 3C:
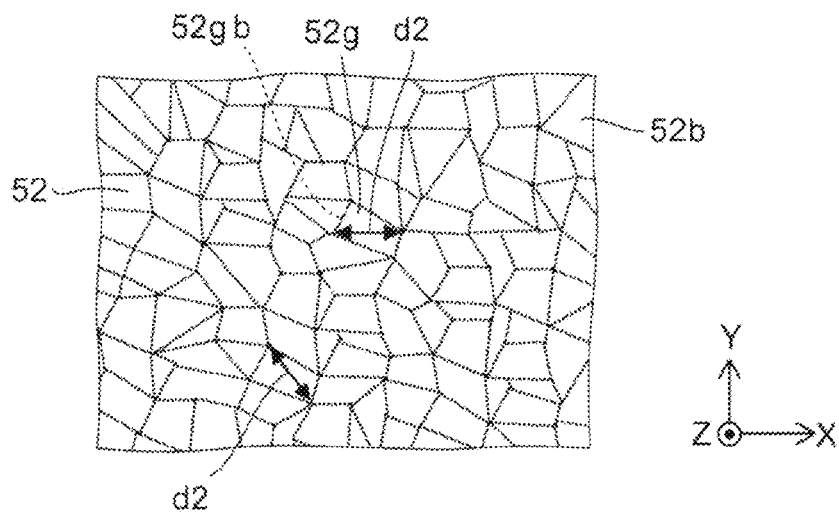

FIGS. 3A to 3C are schematic sectional views illustrating the configuration of a part of the semiconductor light emitting device according to the embodiment.

FIG. 3A is a sectional view when a part of the semiconductor light emitting device 110 is cut in a plane parallel to the Z-axis. FIG. 3B is a plan view schematically showing the configuration of the first conductive layer 51 when the first conductive layer 51 is viewed along the Z-axis. FIG. 3C is a plan view schematically showing the configuration of the second conductive layer 52 when the second conductive layer 52 is viewed along the Z-axis.

As shown in FIG. 3A, the first conductive layer 51 includes a plurality of grains (plurality of first grains 51g). A grain boundary (first grain boundary 51gb) is provided between the plurality of the first grains 51g. That is, a region between the first grain boundaries 51gb forms the first grain 51g.

The second conductive layer 52 includes a plurality of grains (plurality of first grains 52g). A grain boundary (second grain boundary 52gb) is provided between the plurality of the second grains 52g. That is, a region between the second grain boundaries 52gb forms the second grain 52g.

The diameter of the first grain 51g is greater than that of the second grain 52g.

The shape of such a grain is found based on, for example, a transmission electron microscopic image.

For example, the diameter of the first grain 51g at the center along the axis (Z-axis) in the direction of the thickness of the first conductive layer 51 (diameter along the axis perpendicular to the Z-axis) is greater than the diameter of the second grain 52g at the center along the axis (Z-axis) in the direction of the thickness of the second conductive layer 52 (diameter along the axis perpendicular to the Z-axis).

For example, the plurality of the first grains 51g have a first average grain diameter d1. The first average grain diameter d1 is, for example, an average of diameters of the plurality of the first grains 51g at the center along the Z-axis of the first conductive layer 51. The first average grain diameter d1 is, for example, an average of diameters along, for example, the X-axis (or Y-axis) of the plurality of the first grains 51g at the center along the Z-axis of the first conductive layer 51.

For example, the plurality of the second grains 52g have a second average grain diameter d2. The second average grain diameter d2 is, for example, an average of diameters of the plurality of the second grains 52g at the center along the Z-axis of the second conductive layer 52. The second average grain diameter d2 is, for example, an average of diameters along, for example, the X-axis (or Y-axis) of the plurality of the second grains 52g at the center along the Z-axis of the second conductive layer 52.

The first average grain diameter d1 is greater than the second average grain diameter d2.

As shown in FIG. 3A, the first conductive layer 51 has a first surface 51a on the side of the second conductive layer 52 and a second surface 51b on the opposite side of the second conductive layer 52. Furthermore, the second conductive layer has a third surface 52a on the side of the second semiconductor layer 20 and a fourth surface 52b on the side of the first conductive layer 51.

As the first average grain diameter d1, for example, an average of diameters of the plurality of the first grains 51g on the first surface 51a may be used. As the first average grain diameter d1, for example, an average of diameters of the plurality of the first grains 51g on the second surface 51b may be used.

As the second average grain diameter d2, for example, an average of diameters of the plurality of the second grains 51g on the third surface 52a may be used. As the second average grain diameter d2, for example, an average of diameters of the plurality of the second grains 51g on the fourth surface 52b may be used.

In this case also, the first average grain diameter d1 is greater than the second average grain diameter d2.

FIG. 3B illustrates the plurality of the first grains 51g on the second surface 51b. As shown in FIG. 3B, the shapes of the plurality of the first grains 51g differ from one another.

FIG. 3C illustrates the plurality of the second grains 52g on the fourth surface 52b. As shown in FIG. 3C, the shapes of the plurality of the second grains 52g differ from one another.

When the grain has an elongated shape, the diameter of the grain is determined as the length of the grain along an axis in the direction of the longer diameter. That is, the maximum value of the diameter of each of the grains is determined as the diameter of the grain. Then, an average of the diameters of the plurality of grains is determined as an average diameter (the first average grain diameter d1 or the second average grain diameter d2).

When the first average grain diameter d1 and the second average grain diameter d2 are found quantitatively, the values described in FIG. 3A are used. That is, the first average grain diameter d1 is an average of diameters of the plurality of the first grains 51g at the center along the Z-axis of the first conductive layer 51. Then, the second average grain diameter d2 is an average of diameters of the plurality of the second grains 52g at the center along the Z-axis of the second conductive layer 52.

In the semiconductor light emitting device 110 according to the embodiment, the second average grain diameter d2 is smaller than the first average grain diameter d1 and is 150 nm or less. That is, the second conductive layer 52 includes a polycrystal having the second average grain diameter d2, which is smaller than the first average grain diameter d1 and is 150 nm or less.

Because of the above, it is possible to provide a semiconductor light emitting device excellent in electrical characteristics and processability.

The thickness of the second conductive layer 52 (thickness along the Z-axis) is less than that of the first conductive layer 51 (thickness along the Z-axis).

As will be described later, the first conductive layer 51 and the second conductive layer 52 can be formed by the vapor phase epitaxy method. For example, the first conductive layer 51 and the second conductive layer 52 can be formed by the sputtering method.

The second average grain diameter d2 in the second conductive layer 52 provided on the second semiconductor layer is small. Thus excellent electrical characteristics are obtained between the second conductive layer 52 and the second semiconductor layer 20. That is, the contact resistance between the second conductive layer 52 and the second semiconductor layer 20 is low.

On the other hand, as described already, the thickness of the second conductive layer 52 is less than that of the first conductive layer 51. Thus, the second average grain diameter d2 in the second conductive layer 52 is smaller than the first average grain diameter d1 in the first conductive layer 51, and then, excellent processability can be secured in the second conductive layer 52 even if the processability of the material of the second conductive layer 52 is low.

The thickness of the second conductive layer 52 is, for example, 100 nm or less. This makes it easy to obtain excellent processability of the second conductive layer 52. It is more desirable for the thickness of the second conductive layer 52 to be 50 nm or less. Thus, more excellent processability can be obtained.

On the other hand, the thickness of the first conductive layer 51 can be determined from the viewpoint of the electrical characteristics and the optical characteristics.

That is, if the thickness of the first conductive layer 51 is extremely small, the resistance of the transparent electrode 50 becomes too high. Furthermore, the thickness of the transparent electrode 50 (the total thickness of the first conductive layer 51 and the second conductive layer 52) is set so that the transmittance of the transparent electrode 50 is high. A relationship between thickness and transmittance of the transparent electrode 50 will be described later.

Hereinafter, the result of an experiment on a relationship between the grain diameter of a transparent conductive film that forms the transparent electrode 50, the contact resistance, and the processability will be described. In the experiment, an ITO film was formed as a transparent conductive film on the second semiconductor layer 20. At this time, specimens of the ITO films the thicknesses of which are different were manufactured.

In the formation of the transparent conductive film, a target of ITO was used and an inert gas atmosphere substantially not including oxygen was used. Immediately after the transparent conductive film is formed, the transparent conductive film is, for example, amorphous. Alternatively, immediately after the transparent conductive film is formed, the transparent conductive film is, for example, in a state where an amorphous portion and a polycrystalline portion are mixed.

After forming the transparent conductive film, the transparent conductive film was processed into a predetermined shape. Then, the residue at the time of the processing was evaluated by observing the level of residue using an optical microscope or a scanning electron microscope.

After that, the transparent conductive film was subjected to heat treatment. This causes the transparent conductive film to be into a polycrystalline state. The heat treatment was performed under the condition of presence of oxygen. Specifically, the heat treatment was performed in an atmosphere including air.

By changing the sputtering conditions for formation of the transparent conductive film, the grain diameter in the transparent conductive film after the heat treatment changes. Specifically, in the experiment, electric power used at the time of sputtering was changed when forming the transparent conductive film.

Then, the grain diameter of the transparent conductive film after the heat treatment was measured. Furthermore, after the heat treatment, the contact resistance between the transparent conductive film and the second semiconductor layer 20 was measured.

Figure 4A:
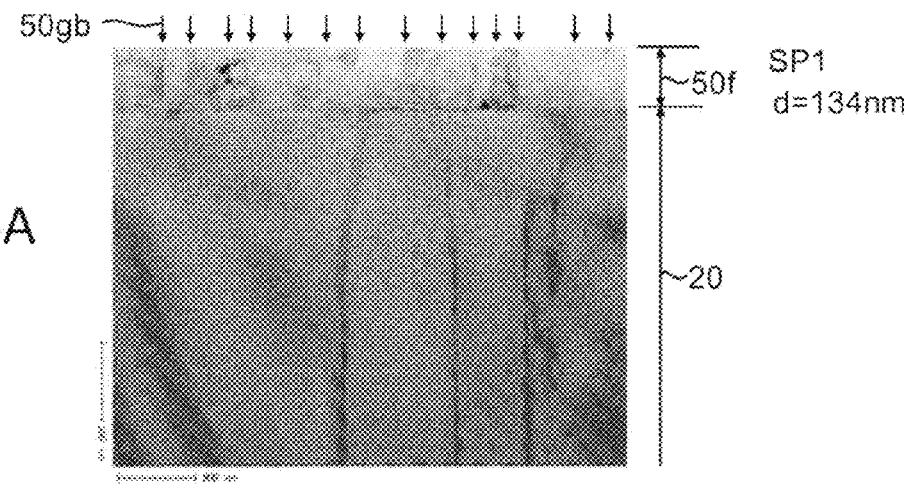
FIGS. 4A to 4C are microscopic photo images of the transparent conductive film.
Figure 4B:
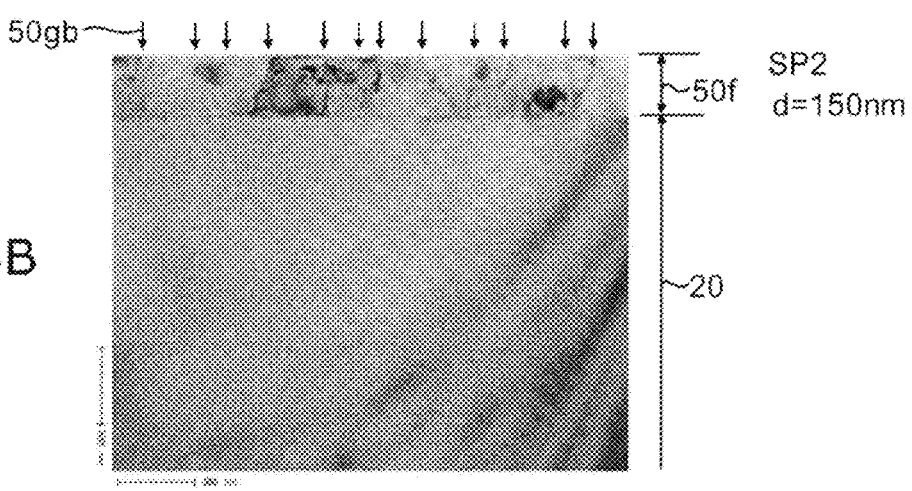
Figure 4C:
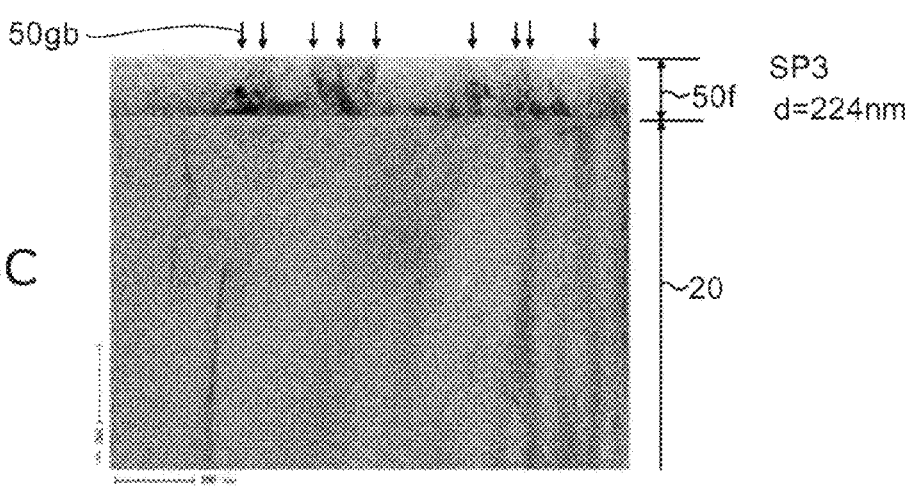

FIGS. 4A to 4C are microscopic photo images of the transparent conductive film.

FIGS. 4A to 4C correspond to first to third specimens SP1 to SP3, respectively. For the first to third specimens SP1 to SP3, electric power at the time of sputtering is different. As shown in these Figures, the buffer layer 6 and the second semiconductor layer 20 (GaN layer) are formed sequentially on the sapphire substrate 5 and a transparent conductive film 50ƒ is formed further thereon. In these Figures, a grain boundary 50gb of the transparent conductive film 50ƒ is shown by an arrow.

As shown in FIG. 4A, in the first specimen SP1, the intervals between the grain boundaries 50gb are narrow. The average grain diameter in the first specimen SP1 is 134 nm.

As shown in FIG. 4B, in the second specimen SP2, the intervals between the grain boundaries 50gb are wider than those in the first specimen SP1. The average grain diameter in the second specimen SP2 is 150 nm.

As shown in FIG. 4C, in the third specimen SP3, the intervals between the grain boundaries 50gb are wider than those in the second specimen SP2. The average grain diameter in the third specimen SP3 is 224 nm.

As described above, it is possible to control the average grain diameter of the transparent conductive film 50ƒ by the manufacturing conditions.

Figure 5A:
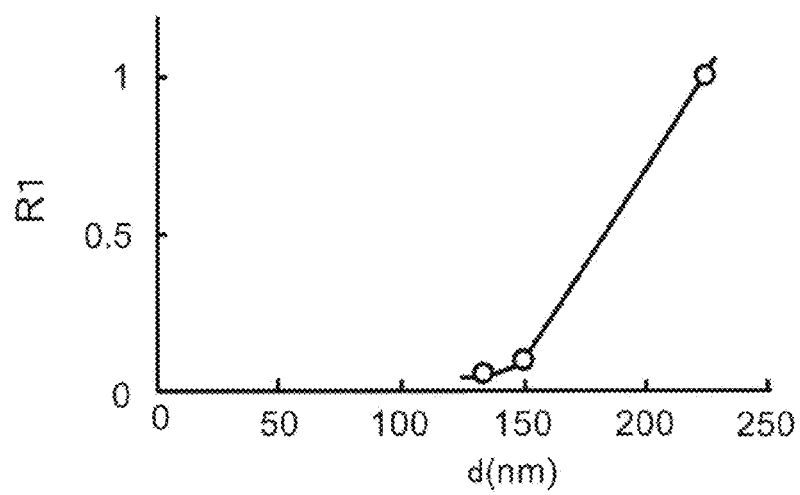
FIGS. 5A to 5C are graphs illustrating the characteristics of the semiconductor light emitting device.
Figure 5B:
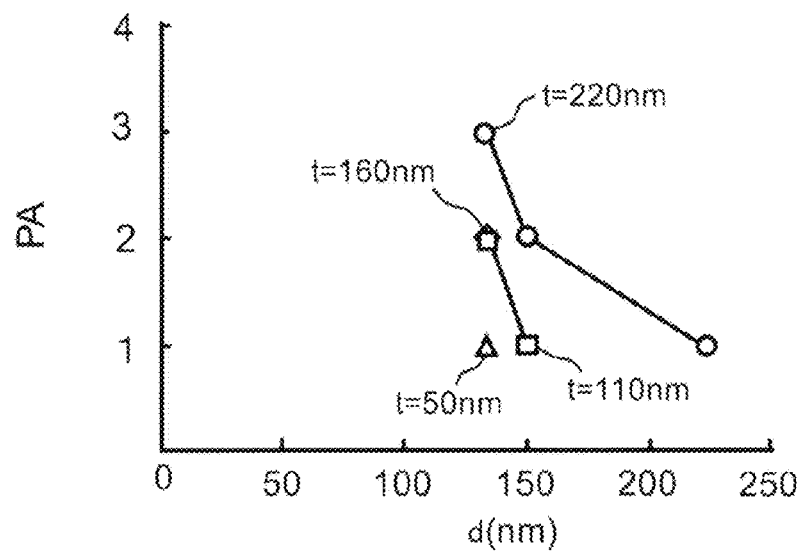
Figure 5C:
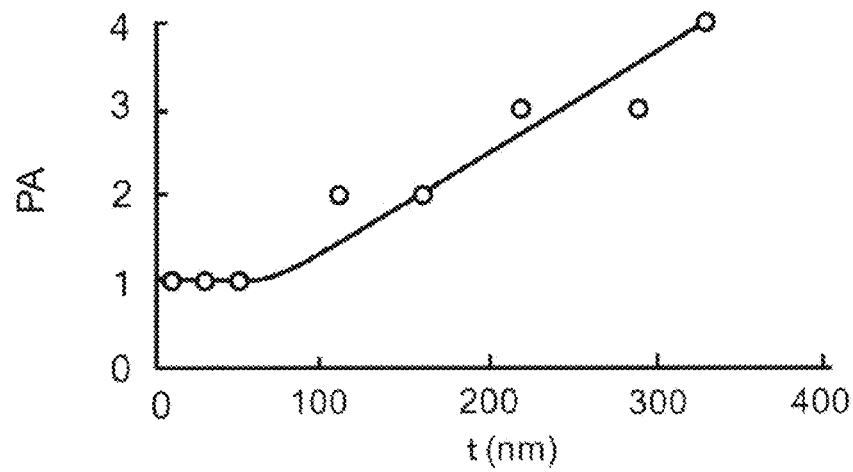

FIGS. 5A to 5C are graphs illustrating the characteristics of the semiconductor light emitting device.

FIG. 5A shows a relationship between a contact resistance R1 between the transparent conductive film and the second semiconductor layer 20 and a grain diameter d of the transparent conductive film. In FIG. 5A, the contact resistance R1 is expressed by relative values. FIG. 5B shows a relationship between a processability index PA of the transparent conductive film and the grain diameter d of the transparent conductive film. Here, the grain diameter d is an average diameter of a plurality of grains in the transparent conductive film. A case where the processability index PA is 1 corresponds to a case where the residue is hardly observed. Then, the greater the processability index PA, the more the residue exists. It is desirable for the processability index PA to be small. FIG. 5C shows a relationship between the processability index PA of the transparent conductive film and a thickness t of the transparent conductive film.

As shown in FIG. 5A, when the grain diameter d of the transparent conductive film is great, the contact resistance R1 is high. When the grain diameter d is small, the contact resistance R1 is low. From this result, it is desirable for the grain diameter d to be small from the viewpoint of the contact resistance R1. In particular, when the grain diameter d is 150 nm or less, the effect of reduction in the contact resistance R1 becomes remarkable.

As shown in FIG. 5B, when the grain diameter d of the transparent conductive film is great, the processability index PA is small and the residue is little. When the grain diameter d is small, the processability index PA is great, that is, the residue is much.

As shown in FIG. 5B, the smaller the thickness t of the transparent conductive film, the smaller the processability index PA is, and this is desirable. When the thickness t is great, it is desirable for the grain diameter d to be 150 nm or more from the viewpoint of processability.

As shown in FIG. 5C, when the thickness t of the transparent conductive film is small, the processability index PA is small and the residue is small. When the thickness t is great, the processability index PA is great, that is, the residue is great. As shown in FIG. 5C, when the thickness t is 100 nm or less, the processability index PA is small, and this is desirable. Furthermore, when the thickness t is 50 nm or less, the processability index PA is small, substantially 1, and a state where residue hardly occurs can be obtained. Here, it is difficult to visually inspect the degree of processing of a film having a thickness of 50 nm or less and thus, data of a stacked film in which transparent conductive films having the processability index of 1 and the grain diameter d of 230 nm are stacked is shown.

The configuration of the embodiment is determined based on the characteristics found by the result of the experiment conducted by the inventors of the invention.

That is, the second average grain diameter d2 is smaller than the first average grain diameter d1 and is 150 nm or less. Thus, a low contact resistance and high processability can be obtained. Specifically, it is desirable for the second average grain diameter d2 to be 10 nm or more and 150 nm or less. When the second average grain diameter d2 is less than 10 nm, the transmittance is reduced by scattering of light at the grain boundary.

On the other hand, the first average grain diameter d1 is greater than the second average grain diameter d2. Thus, excellent processability can be obtained. Specifically, the first average grain diameter d1 is greater than 150 nm and 1 μm or less. When the first average grain diameter d1 exceeds 1 μm, for example, distortion is applied to the second conductive layer 52 and the contact resistance becomes high. In particular, it is desirable for the first average grain diameter d1 to be greater than 150 nm and 500 nm or less. This makes it possible to maintain high transmittance in the first conductive layer 51. Furthermore, high processability can be maintained.

From the result illustrated in FIG. 5C, the thickness of the second conductive layer 52 is set to 100 nm or less. It is more desirable for the thickness of the second conductive layer 52 to be 50 nm or less. Thus, still higher processability can be obtained. It is desirable for the thickness of the second conductive layer 52 to be 1 nm or more. Thus, a low contact resistance can be obtained. If the thickness of the second conductive layer 52 is less than 1 nm, there may be a case where the contact resistance becomes high.

It is desirable for the thickness of the first conductive layer 51 to be 50 nm or more and 400 nm or less. If the thickness of the first conductive layer 51 is less than 50 nm, the resistance of the transparent electrode 50 (the first conductive layer 51 and the second conductive layer 52) becomes too high. If the thickness of the first conductive layer 51 is greater than 400 nm, for example, the light extraction efficiency becomes easily reduced.

Furthermore, by appropriately setting the thickness of the first conductive layer 51 and the thickness of the second conductive layer 52 to the above values, it is possible to reduce the volume resistivity of the transparent electrode 50 (the first conductive layer 51 and the second conductive layer 52). This allows more excellent electrical characteristics to be obtained.

In the transparent electrode 50, a phenomenon of interference of light occurs. Consequently, by adjusting the thickness (and the refractive index) of the transparent electrode 50, a high transmittance can be obtained.

The thickness t of the transparent electrode 50 is designed so that the transmittance of light emitted to the top surface becomes maximum (reflectance becomes minimum). Hereinafter, the result of a simulation of a relationship between the thickness t, the refractive index, and the reflectance of the transparent electrode 50 will be described.

Figure 6:
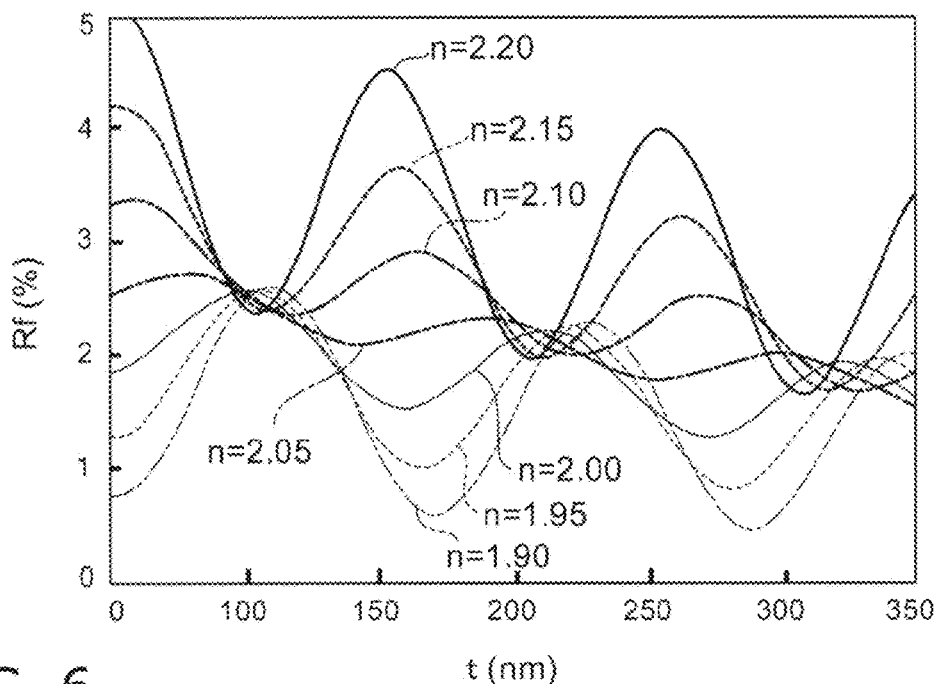
FIG. 6 is a graph illustrating the characteristics of the semiconductor light emitting device according to the embodiment.

FIG. 6 is a graph illustrating the characteristics of the semiconductor light emitting device according to the embodiment.

The horizontal axis of the graph represents the thickness t of the transparent electrode 50. The vertical axis represents reflectance Rf. In the graph, the result of simulation of the reflectance Rf when refractive index n of the transparent electrode 50 is changed within the range of 1.90 to 2.20. In the simulation, the device structure is a stacked structure of a p-type GaN layer, an ITO layer, a SiO₂ layer (refractive index n=1.45), a resin layer (refractive index n=1.4) and the wavelength of light is set to 450 nm. That is, the configuration used in the simulation corresponds to a configuration in which a resin layer is further provided on an insulating layer 60 (SiO₂ layer) in a semiconductor light emitting device 111, to be described later.

As shown in FIG. 6, the reflectance Rf changes depending on the thickness t and the refractive index n of the transparent electrode 50. The refractive index of ITO with a low resistivity is 1.9 or more and 2.0 or less. Consequently, from FIG. 6, when ITO with a low resistivity is used as the transparent electrode 50, it is desirable to set the thickness t (sum of the thickness of the first conductive layer 51 and the thickness of the second conductive layer 52) either to more than 150 nm and 200 nm or less, or to 260 nm or more and 330 nm or less. This allows the low reflectance Rf to be obtained. That is, a high transmittance can be obtained.

It is desirable to set the thickness of the second conductive layer 52 either to a value more than 150 nm and 200 nm or less, which is the thickness t of the transparent electrode 50, minus the thickness of the first conductive layer 51, or to a value of 260 nm or more and 330 nm or less, which is the thickness t of the transparent electrode 50, minus the thickness of the first conductive layer 51.

Thus, the optically excellent characteristics can be further obtained.

For example, as a first reference example, the configuration can be supposed for the transparent electrode 50, in which a stacked film of a film by the vacuum evaporation method and a film by the spray thermal decomposition method is used. This makes a film in which the grain diameters differ from one another to be formed. However, a layer by the vacuum evaporation method has a low density and low thermal durability. Therefore, the first reference example has a practical problem.

As a second reference example, the configuration can be supposed for the transparent electrode 50, in which a stacked film of a film by the vacuum evaporation method and a film by the sputtering method is used. At this time also, the layer by the vacuum evaporation has a low density and low thermal durability.

On the contrary to this, in the embodiment, the first conductive layer 51 and the second conductive layer 52 are formed by the sputtering method. Then, by changing the conditions (for example, electric power) at the time of sputtering, the grain diameter of the first conductive layer 51 is changed into the grain diameter of the second conductive layer 52. Therefore, in the embodiment, the density of the film is high and the thermal durability is high. Furthermore, as described above, the grain diameter (the second average grain diameter d2) of the second conductive layer 52 is determined by the characteristics found by the inventors of the invention. This makes it possible to provide a semiconductor light emitting device having an electrode excellent in the electrical characteristics and processability.

The film forming method of a transparent conductive film such as ITO includes the electron beam evaporation method, the sputtering method, and the sol-gel method. According to the experiment of the inventors, when forming ITO with a low volume resistivity, the film formation by the sputtering method is effective.

When forming an ITO film by sputtering, it is possible to obtain an amorphous ITO film by setting power low in film formation in an atmosphere substantially not including oxygen. This allows an ITO film excellent in processability to be obtained. However, in the amorphous ITO film, there is a tendency for the contact resistance for the GaN layer to become high. On the contrary, if power is high at the time of film formation, the contact resistance becomes low, however, microcrystals are contained in the film, resulting in the cause of residue. That is, the processability is reduced.

In the embodiment, by appropriately setting the configuration of the first conductive layer 51 and the second conductive layer 52, highly excellent electrical characteristics and high processability are obtained at the same time.

In the embodiment, the second conductive layer 52 has a function to obtain excellent contact characteristics. When the second average grain diameter d2 of the second conductive layer 52 is small, the area of close adhesion with the second semiconductor layer 20 becomes large and the resistance is reduced. It is desirable for the second average grain diameter d2 to be, for example, 10 nm or more and 50 nm or less. The first conductive layer 51 has a function to reduce the resistance for energization. It is desirable for the volume resistivity of the first conductive layer 51 to be low. The greater the first average grain diameter d1, the less the grain boundary scattering becomes. Thus, the conductivity is increased. It is desirable for the first average grain diameter d1 of the first conductive layer 51 to be 300 nm or more and 500 nm or less.

Hereinafter, an example of a method of manufacturing the semiconductor light emitting device 110 will be described. The manufacturing method is a method of manufacturing a semiconductor light emitting device including the first semiconductor layer 10 of the first conductivity type, the second semiconductor layer 20 of the second conductivity type, the light emitting part 30 provided between the first semiconductor layer 10 and the second semiconductor layer 20, the first conductive layer 51 which includes a polycrystal having the first average grain diameter d1 and is transparent to light emitted from the light emitting part 30, and the second conductive layer 52 which is in contact with the second semiconductor layer 20 and the first conductive layer 51 between the second semiconductor layer 20 and the first conductive layer 51, includes a polycrystal having the second average grain diameter d2 smaller than the first average grain diameter d1, and is transparent to the above-mentioned light.

Figure 7:
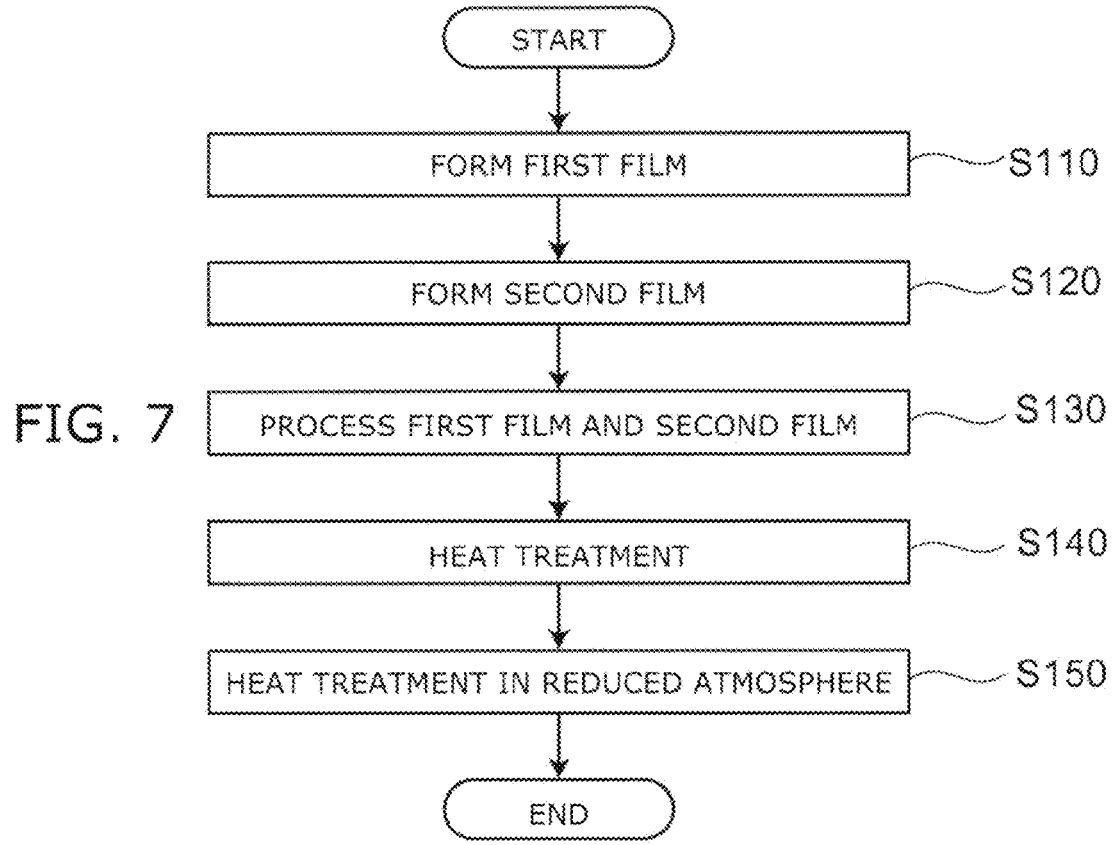
FIG. 7 is a flowchart illustrating a method of manufacturing the semiconductor light emitting device according to the embodiment.

FIG. 7 is a flowchart illustrating the method of manufacturing the semiconductor light emitting device according to the embodiment.

Figure 8A:
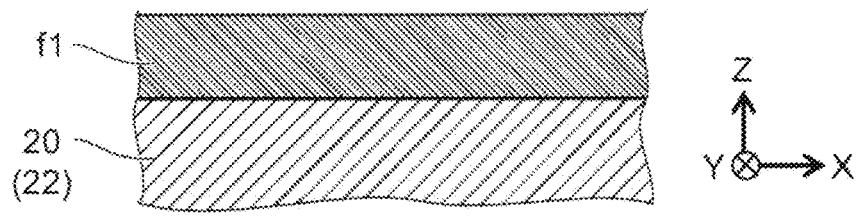
FIGS. 8A to 8C are schematic sectional views in order of process, illustrating the method of manufacturing the semiconductor light emitting device according to the embodiment.
Figure 8B:
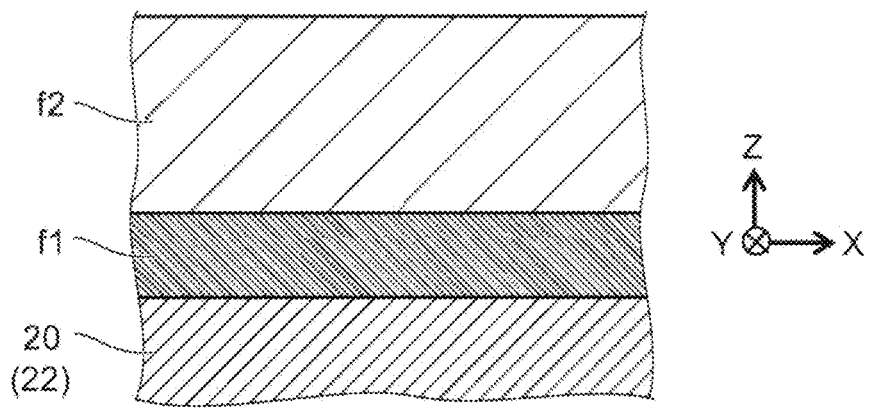
Figure 8C:
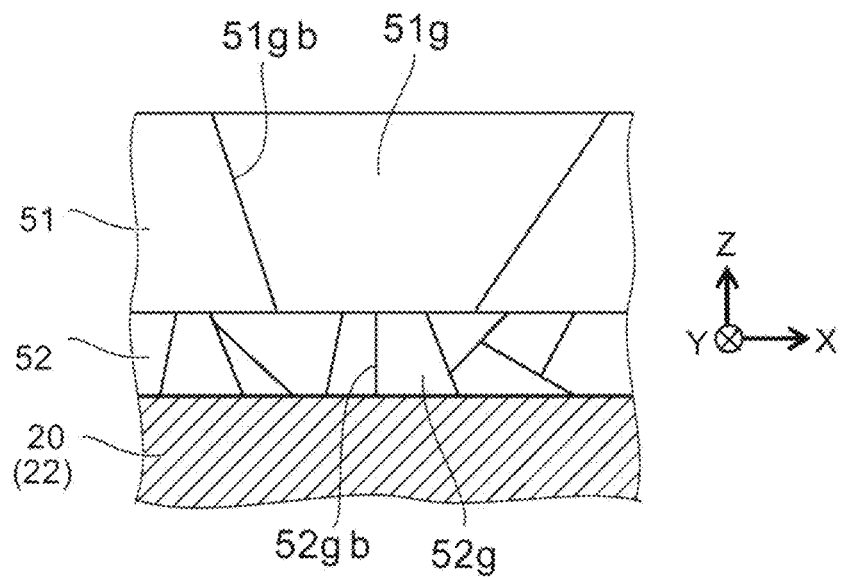

FIGS. 8A to 8C are schematic sectional views in order of process, illustrating the method of manufacturing the semiconductor light emitting device according to the embodiment.

As shown in FIG. 7 and FIG. 8A, a first film f1, which forms the second conductive layer 52, is formed on the second semiconductor layer 20 in an atmosphere of a noble gas by the sputtering method using first electric power (step S110). That is, in an Ar atmosphere, an amorphous ITO film including a comparatively large amount of microcrystal is formed. Here, the concentration of oxygen during the period of film formation is adjusted so that the composition of the ITO film becomes oxygen-deficient.

As shown in FIG. 7 and FIG. 8B, a second film f2, which forms the first conductive layer 51, is formed on the first film f1 in an atmosphere of a noble gas by the sputtering method using second electric power smaller than the first electric power (step S120). For example, the formed second film f2 is amorphous. That is, after reducing the power at the time of sputtering, an amorphous ITO film having a comparatively small amount of microcrystal is formed in an Ar atmosphere.

Meanwhile, not limited to the above, when forming the first film f1 and the second film f2, a target including an oxide including at least one of elements selected from the group consisting of, for example, In, Sn, Zn, and Ti is used. The first film f1 and the second film f2 formed by sputtering include an oxide including at least one of elements selected from the group of In, Sn, Zn, and Ti.

The formation of the first film f1 and the formation of the second film f2 are performed in an atmosphere substantially not including oxygen. That is, the first film f1 and the second film f2 are films including an oxygen-deficient transparent conductive oxide.

Here, it is desirable for sum of the thickness of the first film f1 and the thickness of the second film f2 to be one of larger than 150 nm and 200 nm or less, and 260 nm or more and 330 nm or less. Thus, the low reflectance Rf is obtained. That is, the high transmittance is obtained.

As shown in FIG. 7 and FIG. 8C, the first conductive layer 51 and the second conductive layer 52 are formed by subjecting the first film f1 and the second film f2 to heat treatment in an atmosphere including oxygen (step S140). The second average grain diameter of the second conductive layer 52 is, for example, 150 nm or less.

By subjecting the first film f1 and the second film f2 to heat treatment in an oxidizing atmosphere, oxygen is taken in the film. This causes a crystal grow. Therefore, from the first film f1, the polycrystalline second conductive layer 52 having a grain diameter (the second average grain diameter d2) of, for example, 10 nm or more and 150 nm or less is obtained. Then, from the second film f2, the polycrystalline first conductive layer 51 having a grain diameter (the first average grain diameter d1) of more than 150 nm and 1 μm or less is obtained.

This makes it possible to manufacture a semiconductor light emitting device having an electrode excellent in electrical characteristics and processability.

As shown in FIG. 7, it may also be possible to further perform a process of processing the first film f1 and the second film f2 into a predetermined shape (step S130). That is, the manufacturing method can further include a process of processing the first film f1 and the second film f2 into a predetermined shape (step S130) between the formation of the second film f1 (step S120) and the above-mentioned heat treatment (step S140).

Before heat treatment, the second film f2 is amorphous, and thus, the processability is comparatively high. Furthermore, even though the first film f1 is polycrystalline, the thickness of the first film f1 is comparatively small, and thus, the processability is comparatively high. After that, by forming the second conductive layer 52 and the first conductive layer 51, respectively, from the first film f1 and the second film f2 by heat treatment, highly excellent electrical characteristics and high processability are obtained at the same time.

Furthermore, as shown in FIG. 7, the manufacturing method can further include a process of further subjecting the first film f1 (the second conductive layer 52) and the second film f2 (the first conductive layer 51) to heat treatment in a reduction atmosphere (step S150) after the heat treatment in an atmosphere including oxygen (step S140).

This makes it possible to remove excess oxygen included in the second conductive layer 52 and the first conductive layer 51. That is, it is possible to obtain an ITO film with a desired volume resistivity by separating excess oxygen from the film by sinter processing in a reduction atmosphere.

As described above, in the embodiment, first, an ITO thin film including a comparatively large amount of microcrystal is formed by sputtering on the p-type GaN layer. Thus, excellent contact characteristics with the p-type GaN layer are obtained. After this, the power of sputtering is reduced and an ITO thin film including a comparatively small amount of microcrystal is formed in an Ar atmosphere. This film is an amorphous film, and thus, processability is excellent. After that, by subjecting these films to sinter processing in an atmosphere including oxygen, they change into a polycrystalline film having a crystal grain diameter of 10 nm or more and 150 nm or less and a polycrystalline film having a crystal grain diameter of more than 150 nm and 500 nm or less. By using the structure and process, it becomes possible to obtain a low contact resistance and high processability at the same time.

Figure 9:
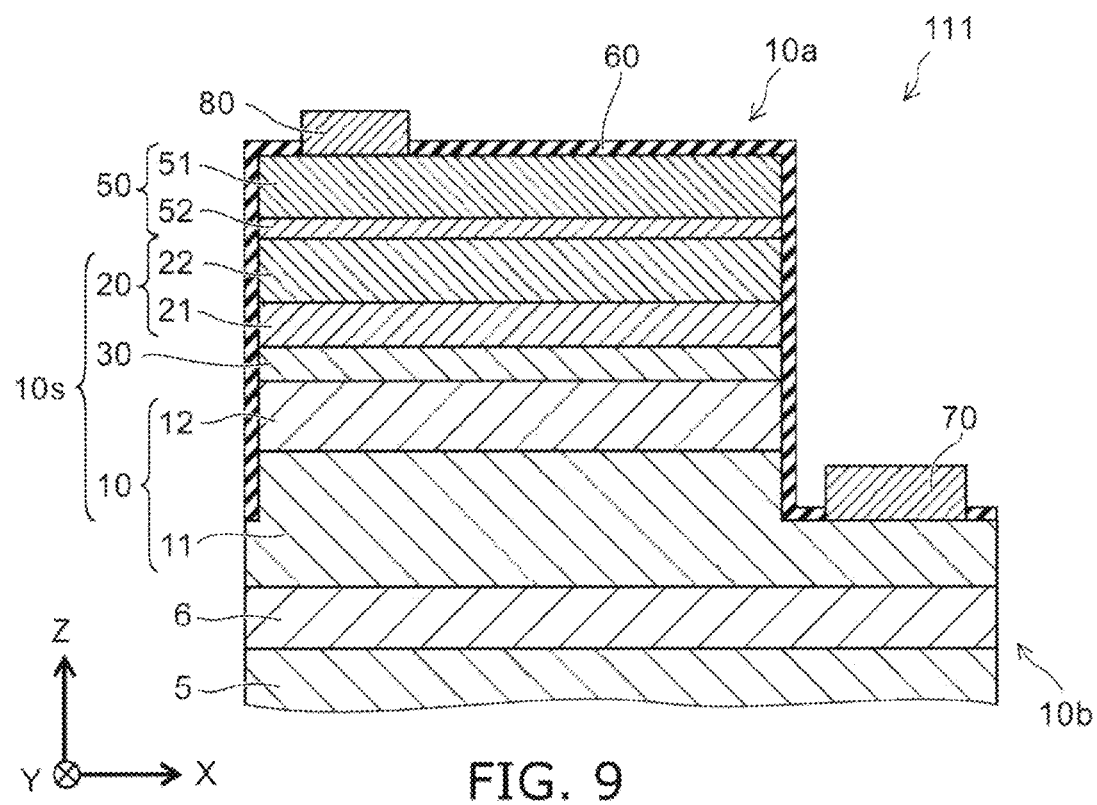
FIG. 9 is a schematic sectional view illustrating the configuration of another semiconductor light emitting device according to the embodiment.

FIG. 9 is a schematic sectional view illustrating the configuration of another semiconductor light emitting device according to the embodiment.

As shown in FIG. 9, the other semiconductor light emitting device 111 according to the embodiment further includes the insulating layer 60. The first conductive layer 51 is provided between the insulating layer 60 and the second conductive layer 52. The insulating layer 60 is transparent to emission light. As the insulating layer 60, for example, a silicon oxide film is used. The embodiment is not limited to this and as the insulating layer 60, an arbitrary insulating material being transparent to light emitted from the light emitting part 30 can be used.

The insulating layer 60 is provided at a part other than the part where the first conductive layer 51 is in contact with the second electrode 80. This secures electrical conduction between the first conductive layer 51 and the second electrode 80.

The insulating layer 60 covers, for example, the side surfaces of the first conductive layer 51, the second conductive layer 52, the second semiconductor layer 20, and the light emitting part 30. Furthermore, the insulating layer 60 is provided on the side surface of the first semiconductor layer 10 and the surface of the first semiconductor layer 10 on the side of the first major surface 10a. The insulating layer 60 functions as a passivation film of the stacked structure body 10s. The insulating layer 60 is provided at a part other than the part where the first semiconductor layer 10 is in contact with the first electrode 70. This secures the electrical conduction between the first semiconductor layer 10 and the first electrode 70.

The insulating layer 60 may be provided as necessary or may be omitted.

In the semiconductor light emitting device 111 also, the second conductive layer 52 includes a polycrystal having the second average grain diameter d2 of 150 nm or less, which is smaller than the first average grain diameter d1. This makes it possible to provide a semiconductor light emitting device having an electrode with excellent electrical characteristics and processability.

Figure 10:
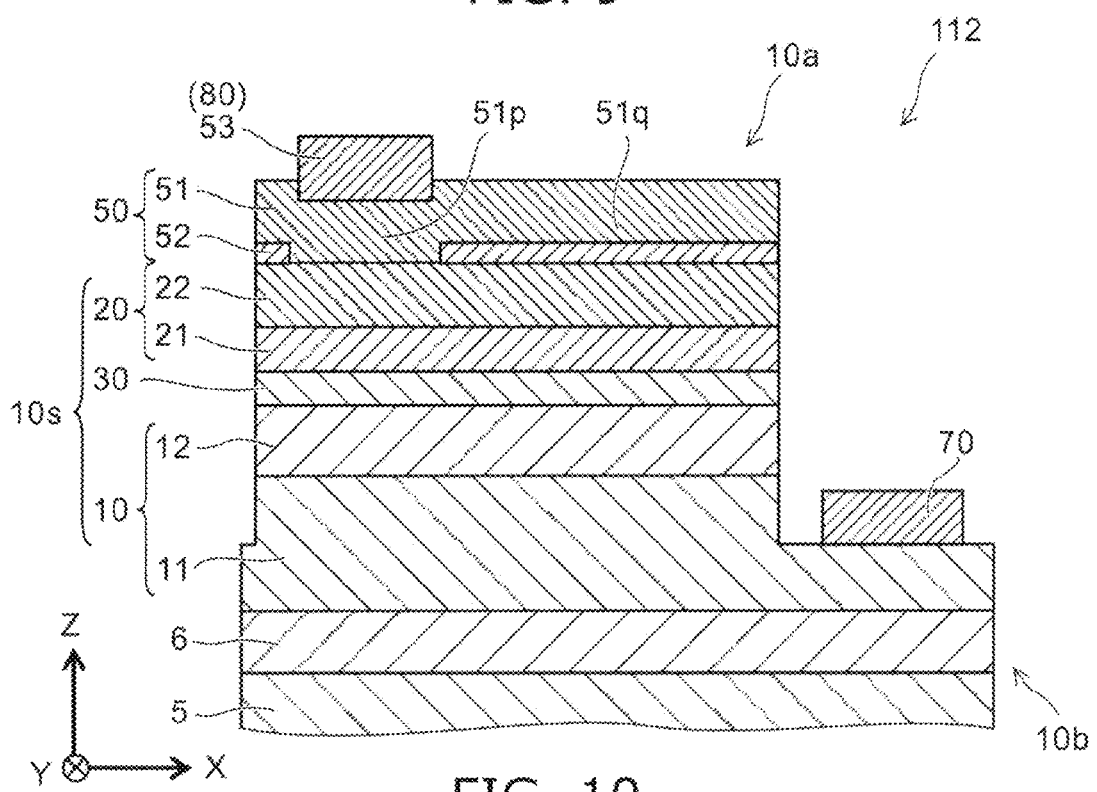
FIG. 10 is a schematic sectional view illustrating the configuration of still another semiconductor light emitting device according to the embodiment.

FIG. 10 is a schematic sectional view illustrating the configuration of another semiconductor light emitting device according to the embodiment. As shown in FIG. 10, another semiconductor light emitting device 112 according to the embodiment further includes a third conductive layer 53 in addition to the first semiconductor layer 10, the second semiconductor layer 20, the light emitting part 30, the first conductive layer 51, and the second conductive layer 52.

The transmittance to the above-mentioned light in the third conductive layer 53 is lower than the transmittance of the first conductive layer 51 and lower than the transmittance of the second conductive layer 52. As the third conductive layer 53, for example, a metal layer is used. The third conductive layer 53 is, for example, the second electrode 80. As the third conductive layer 53, for example, a stacked film of a Ni film and an Au film is used.

The first conductive layer 51 has a first portion 51p and a second portion 51q. The first portion 51p is in contact with the third conductive layer 53 and the second semiconductor layer 20 between the third conductive layer 53 and the second semiconductor layer 20. The second portion 51q is not covered with the third conductive layer 53 and covers at least a part of the second conductive layer 52.

The contact resistance between the first conductive layer 51 and the second semiconductor layer 20 is higher than the contact resistance between the second conductive layer 52 and the second semiconductor layer 20. Thus, the contact resistance at the first portion 51p of the first conductive layer 51, which is in contact with the second semiconductor layer 20, is high. Therefore, light emission at the light emitting part 30 corresponding to the first portion 51p is suppressed. That is, light emission at the second portion 51q where the contact resistance is low is promoted.

That is, light emission at the first portion 51p corresponding to the third conductive layer 53 having a lower transmittance (having light shielding or reflecting property) is suppressed. Thus, the light extraction efficiency is improved.

In the semiconductor light emitting device 112 also, the second conductive layer 52 includes a polycrystal having the second average grain diameter d2 of 150 nm or less, which is smaller than the first average grain diameter d1. This makes it possible to provide a semiconductor light emitting device having an electrode with excellent electrical characteristics and processability.

According to the embodiment, a semiconductor light emitting device having an electrode excellent in electrical characteristics and processability and a method of manufacturing the same are provided.

In the specification, "nitride semiconductor" includes all compositions of semiconductors of the chemical formula $B_x In_y Al_z Ga_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation because of manufacturing processes, etc. and "substantially perpendicular" and "substantially parallel" will suffice.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices such as semiconductor layers, n-type semiconductor layers, p-type semiconductor layers, light emitting parts, transparent electrode layers, electrodes, etc., from the known art. Such practice is included in the scope of the invention to the extent that similar effects thereto are obtained.

Furthermore, any two or more components of the specific examples may be combined within the extent of technical feasibility and are included in the scope of the invention to the extent that the purport of the invention is included.

Moreover, all semiconductor light emitting devices and methods of manufacturing the same practicable by an appropriate design modification by one skilled in the art based on the semiconductor light emitting devices and the methods of manufacturing the same described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a first conductive layer;
   a first semiconductor layer of a first conductivity type;
   a second semiconductor layer of a second conductivity type, the second semiconductor layer being provided between the first conductive layer and the first semiconductor layer;
   a light emitting part provided between the first semiconductor layer and the second semiconductor layer; and
   a second conductive layer being in contact with the second semiconductor layer and the first conductive layer, the second conductive layer being provided between the second semiconductor layer and the first conductive layer,
   the first conductive layer including a first polycrystal having first grain boundaries, the first conductive layer being transmittable with respect to light emitted from the light emitting part,
   the second conductive layer including a second polycrystal having second grain boundaries, the second conductive layer being transmittable with respect to the light,
   an average of first distances between the first grain boundaries being greater than an average of second distances between the second grain boundaries, and
   the average of the second distances being 150 nanometers or less.

2. The device according to claim 1, wherein
   a thickness of the second conductive layer is 100 nanometers or less.

3. The device according to claim 1, wherein
   sum of a thickness of the first conductive layer and the thickness of the second conductive layer is one of more than 150 nanometers and 200 nanometers or less and 260 nanometers or more and 330 nanometers or less.

4. The device according to claim 1, wherein
   the first conductive layer and the second conductive layer include an oxide including at least one of elements selected from the group of In, Sn, Zn, and Ti.

5. The device according to claim 1, further comprising a third conductive layer having transmittance to the light lower than transmittance of the first conductive layer and lower than transmittance of the second conductive layer,
   the first conductive layer including:
   a first portion in contact with the third conductive layer and the second semiconductor layer between the third conductive layer and the second semiconductor layer; and
   a second portion not covered with the third conductive layer and covering at least a part of the second conductive layer.

6. The device according to claim 5, wherein the third conductive layer is a metal layer.

7. The device according to claim 1, wherein a thickness of the second conductive layer is less than a thickness of the first conductive layer.

8. The device according to claim 1, wherein a thickness of the second conductive layer is 50 nanometers or less.

9. The device according to claim 1, wherein a thickness of the first conductive layer is 50 nanometers or more and 400 nanometers or less.

10. The device according to claim 1, wherein the average of the first distances is 150 nanometers or more and 1 micrometers or less.

11. The device according to claim 1, wherein the average of the second distances is 10 nanometers or more.

* * * * *